United States Patent

Khan et al.

(10) Patent No.: US 9,391,578 B2
(45) Date of Patent: Jul. 12, 2016

(54) LOW INTERMEDIATE FREQUENCY RECEIVER

(71) Applicant: ANALOG DEVICES GLOBAL, Hamilton (BM)

(72) Inventors: Muhammad Kalimuddin Khan, Rochestown (IE); Michael J. Deeney, Carrigaline (IE); Niall Kevin Kearney, Killeagh (IE); Kenneth J. Mulvaney, Coolaney (IE); Shane A. O'Mahony, Grenagh (IE)

(73) Assignee: Analog Devices Global, Hamilton (BM)

( * ) Notice: Subject to any disclaimer, the term of this patent is extended or adjusted under 35 U.S.C. 154(b) by 1 day.

(21) Appl. No.: 14/302,223

(22) Filed: Jun. 11, 2014

(65) Prior Publication Data

US 2015/0365118 A1    Dec. 17, 2015

(51) Int. Cl.
*H04B 1/38* (2015.01)
*H03G 3/30* (2006.01)
*H04B 1/30* (2006.01)

(52) U.S. Cl.
CPC .............. *H03G 3/3052* (2013.01); *H04B 1/30* (2013.01); *H04B 2001/305* (2013.01)

(58) Field of Classification Search
CPC ............ H04B 1/30; H04B 1/26; H04B 15/02; H04B 2001/305; H03D 3/008; H03D 7/1441; H03L 7/081; H04L 25/06
USPC ......... 375/346, 136, 147, 219, 316, 324, 345; 455/296, 313, 334, 283, 114.2, 118, 455/127.2, 341, 63.1, 67.13
See application file for complete search history.

(56) References Cited

U.S. PATENT DOCUMENTS

| | | | |
|---|---|---|---|
| 6,748,200 B1 * | 6/2004 | Webster et al. | ............ 455/234.1 |
| 7,215,266 B2 | 5/2007 | Li et al. | |
| 7,221,918 B1 | 5/2007 | Grasbeck et al. | |
| 8,380,149 B2 | 2/2013 | Nonin | |

(Continued)

OTHER PUBLICATIONS

Analog Devices, ADF7242 Data Sheet: Low Power IEEE 802.15.4/ Proprietary GFSK/FSK Zero-IF 2.4 GHz Transceiver IC, Rev. 0, Jul. 2010, 108 pages. Available at: http://www.analog.com/static/imported-files/data_sheets/ADF7242.pdf (accessed: Oct. 16, 2014).

(Continued)

*Primary Examiner* — Leila Malek
(74) *Attorney, Agent, or Firm* — Knobbe, Martens, Olson & Bear, LLP

(57) ABSTRACT

An LIF receiver includes a receiver path comprising: a mixer for mixing a received RF signal with a local oscillator signal to provide an IF signal at a lower frequency than the received RF signal, a bandpass filter for filtering the IF signal, a PGA for amplifying the filtered IF signal, an ADC for converting the amplified filtered IF signal to a digital signal, a converter for converting the digital signal to a baseband digital signal, and an AGC for setting a gain of the PGA in response to a magnitude of the received RF signal. A programmable DC signal source injects a programmed DC offset signal into the amplified filtered IF signal converted by the ADC, and a signal sensor, operatively connected to the receiver path after the PGA, determines a polarity of PGA signal output for a programmed DC offset signal. A controller determines a programmed DC offset signal minimizing a magnitude of the baseband signal in the absence of a received RF signal for at least one gain setting of the PGA.

22 Claims, 5 Drawing Sheets

(56) References Cited

U.S. PATENT DOCUMENTS

| | | |
|---|---|---|
| 8,478,221 B2 | 7/2013 | Ling et al. |
| 2002/0042256 A1* | 4/2002 | Baldwin et al. ............ 455/232.1 |
| 2002/0160734 A1* | 10/2002 | Li et al. ...................... 455/245.1 |

OTHER PUBLICATIONS

Analog Devices, ADF7241 Data Sheet: Low Power IEEE 802.15.4 Zero-IF 2.4 GHz Transceiver IC, Rev. 0, Jan. 2011, 72 pages. Available at: http://www.analog.com/static/imported-files/data_sheets/ADF7241.pdf (accessed: Oct. 16, 2014).

Xianging, Fan, et al., "A CMOS DC Offset Cancellation (DOC) Circuit for PGA of Low IF Wireless Receivers," Proceedings of International Symposium on Signals, Systems and Electronics 2010 (ISSSE2010), 4 pages.

Pham, Duy-Dong, et al, "Feedforward Technique for Offset Cancellation in Broadband Differential Amplifiers," Proceedings of the International Integrated Circuits Symposium 2009 (ISIC 2009), pp. 429-432.

Shih, Horng-Yuan, et al., "A 250 MHz 14 dB-NF 73 dB-Gain 82 dB-DR Analog Baseband Chain With Digital-Assisted DC-Offset Calibration for Ultra-Wideband," IEEE Journal of Solid-State Circuits, vol. 45, No. 2, Feb. 2010, pp. 338-350.

* cited by examiner

LOW INTERMEDIATE FREQUENCY RECEIVER

FIELD

Embodiments of the present invention relate to a low intermediate frequency (IF) receiver with direct current (DC) offset correction.

BACKGROUND

Many modern radio frequency (RF) receivers use a direct conversion or zero-IF (ZIF) architecture. Here an RF signal received at an antenna is fed through mixer driven by a local oscillator (LO) and subsequently filtered to produce a baseband channel demodulated output signal. One of the primary issues addressed in such ZIF receivers is the problem of DC offset. DC offset in a receiver has a number of sources, including:

Inherent random mismatch in the receiver circuitry;
Self-mixing caused by LO energy leaking back through the mixer stage to feed back to the antenna input and then re-entering the mixer stage; and
Blocker-induced, due to 2nd order non-linearity in the mixer stage causing two unwanted signals with closely spaced frequencies to produce a difference term falling within the channel filter bandwidth.

These DC offsets, if left unmitigated, can grow to consume a significant part, or perhaps all, of the dynamic range of the receiver. Offset correction schemes for ZIF receivers can use either purely analog or hybrid analog/digital feedback or feed forward schemes to remove DC offset. Many such offset cancellation schemes have been published, for example, as disclosed in:

Feedforward Technique for Offset Cancellation in Broadband Differential Amplifiers Duy-Dong Pham, James Brinkhoff, Kai Kang, Chyuen-Wei Ang, and Fujiang Lin; and A 250 MHz 14 dB-NF 73 dB-Gain 82 dB-DR Analog Baseband Chain With Digital-Assisted DC-Offset Calibration for Ultra-Wideband Horng-Yuan Shih, Member, IEEE, Chien-Nan Kuo, Member, IEEE, Wei-Hsien Chen, Tzu-Yi Yang, and Kai-Chenug Juang.

U.S. Pat. No. 8,380,149 discloses a DC offset canceller including a first digital-to-analog (DA) converter, a first adder, an amplifier, a comparator, an averaging circuit, and a successive approximation register. The first DA converter is configured to DA-convert first correction data into a first correction voltage. The first adder is configured to add an input signal and the first correction voltage to output a first added signal. The amplifier is configured to amplify the first added signal to output an amplified signal. The comparator is configured to compare the amplified signal and a reference voltage to output a comparison result. The averaging circuit is configured to receive the comparison results of the comparator to obtain a majority decision result by performing majority decision on logical values of the comparison results in a predetermined time period. The successive approximation register is configured to sequentially set each bit of the first correction data based on the majority decision result so that a DC offset in the amplified signal decreases.

U.S. Pat. No. 8,478,221 discloses a wireless communication receiver including a multitude of look-up tables each storing a multitude of DC offset values associated with the gains of an amplification stage disposed in the wireless communication receiver. The entries for each look-up table are estimated during a stage of the calibration phase. During such a calibration stage, for each selected gain of an amplification stage, a search logic estimates a current DC offset number and compares it to a previous DC offset estimate that is fed back to the search logic. If the difference between the current and previous estimates is less than a predefined threshold value, the current estimate is treated as being associated with the DC offset of the selected gain of the amplification stage and is stored in the look-up table. This process is repeated for each selected gain of each amplification stage of interest until the look-up tables are populated.

Also, devices such as ADF7242™ Low Power IEEE 802.15.4/Proprietary GFSK/FSK Zero-IF 2.4 GHz Transceiver IC; and ADF7241™ Low Power IEEE 802.15.4 Zero-IF 2.4 GHz Transceiver IC from Analog Devices, Inc. (Norwood, Mass.) are equipped with an offset correction loop (OCL), which cancels both static and dynamic time-varying offset voltages present in the zero-IF receiver path.

For certain modulations, such as On-Off Keying (00K), ZIF is not a suitable architecture and in these cases, low-IF (LIF) architectures are favored.

In LIF architectures, the demodulated signal is centered at a non-zero frequency. LIF receivers using an analog complex filter have inherent attenuation of DC with the level of attenuation being dependent on the center frequency, bandwidth and roll-off of the filter.

However, depending on the implementation of the LIF architecture, there can still be a requirement to limit DC offset in order to preserve dynamic range.

For example, in a receiver with very narrow band channelization, the channel filter is typically implemented in the digital domain so as to reject very large close-in interferers. This involves the use of an ADC with a dynamic range sufficient to linearly process both wanted and interfering signals. If not addressed, DC offset (both static and dynamic (time-varying)) can potentially consume a significant fraction of the ADC dynamic range.

The DC offset correction schemes referred to above are unsuitable for a low-IF receiver which implements the channel filter in the digital domain. In this case, a down converted interferer may fall anywhere within the passband of the analog anti-alias filter (AAF), including at a lower frequency than the target channel (and even including DC). Hence, any feedback or feed forward scheme which relies on low pass filtering of the signal to extract DC information to close an error correcting loop may also now have within its passband an interfering signal many orders of magnitude greater than the target channel signal. This places unacceptably large requirements for dynamic range on the correction circuitry itself.

Examples of DC offset schemes for LIF receivers include:

A CMOS DC Offset Cancellation (DOC) Circuit for PGA of Low IF Wireless Receivers Fan Xiangning, Member IEEE, Sun Yutao, Feng Yangyang discloses a DC negative feedback technique based DC offset canceller (DOC) which can be used in a CMOS programmable gain amplifier (PGA) of a low intermediate frequency (IF) receiver. However, this approach is only suitable for an analog complex filter.

U.S. Pat. No. 7,215,266 discloses cancelling static and dynamic DC offsets by combining a digital DC offset correction scheme with an analog DC offset correction scheme. A feedback-based digital DC offset correction scheme provides different adjustment levels for a plurality of discrete gain states and the analog DC offset correction scheme operates in different cancellation modes dependent on a frame structure. A digital DC offset correction scheme collects DC offset control information and provides adjustment levels. In addition, a negative-feedback based switchable high pass filter has a plurality modes of operation, where one mode of operation includes an all-pass filter.

U.S. Pat. No. 7,221,918 discloses an RF receiver comprising a radio-frequency down-converter for receiving and down-converting an input RF signal to a lower frequency analog signal (e.g., an IF signal or baseband signal) and analog processing circuitry for receiving the lower frequency analog signal from the RF down-converter and outputting a processed analog signal. The processed analog signal includes a DC-offset signal introduced by the RF down-converter and the analog processing circuitry. The RF receiver also comprises an ADC circuit for converting the processed analog signal to a sequence of digital samples and a DC-offset correction circuit for detecting the DC-offset signal in a digital output signal of the RF receiver. The DC-offset correction circuit adds a DC-offset correction signal to the lower frequency analog signal. Adding the DC-offset correction signal to the lower frequency analog signal reduces the DC-offset signal in the processed analog signal at the analog processing circuitry output.

SUMMARY

According to a first aspect of the present invention, there is provided a low intermediate frequency (IF) receiver with direct current (DC) offset correction. The receiver includes a receiver path comprising: a mixer for mixing a received RF signal with a local oscillator signal to provide an intermediate frequency (IF) signal at a lower frequency than said received RF signal, a bandpass filter for filtering said IF signal, a programmable gain amplifier (PGA) for amplifying said filtered IF signal, an analog-to-digital converter (ADC) for converting said amplified filtered IF signal to a digital signal, a converter for converting said digital signal to a baseband digital signal, and an automatic gain controller (AGC) for setting a gain of said PGA in response to a magnitude of said received RF signal. The receiver further comprises a programmable direct-current (DC) signal source for injecting a programmed DC offset signal into said amplified filtered IF signal converted by said ADC, a signal sensor operatively connected to said receiver path after said PGA for determining a polarity of PGA signal output for a programmed DC offset signal, and a controller for determining a programmed DC offset signal minimizing a magnitude of said baseband signal in the absence of a received RF signal for at least one gain setting of said PGA.

In a second aspect, there is provided a low intermediate frequency (IF) receiver with direct current (DC) offset correction. The receiver includes a receiver path comprising: a mixer for mixing a received RF signal with a local oscillator signal to provide an intermediate frequency (IF) signal at a lower frequency than said received RF signal, a programmable gain amplifier (PGA) for amplifying said IF signal, said PGA providing a differential signal output, an analog-to-digital converter (ADC) for converting said amplified filtered IF signal to a digital signal, a converter for converting said digital signal to a baseband digital signal, and an automatic gain controller (AGC) for setting a gain of said PGA in response to a magnitude of said received RF signal. The receiver further comprises: a programmable direct-current (DC) signal source for injecting a programmed DC offset signal into said amplified filtered IF signal converted by said ADC, a signal sensor comprising a comparator connected to said PGA differential signal output to indicate a polarity of said PGA output for a programmed DC offset signal, a second signal sensor operatively connected to said converter output for determining a polarity of said baseband digital signal for a programmed DC offset signal, and a controller operable to selectively switch between said signal sensors for determining a programmed DC offset signal minimizing a magnitude of said baseband signal in the absence of a received RF signal for at least one gain setting of said PGA.

BRIEF DESCRIPTION OF THE DRAWINGS

Embodiments of the invention will now be described, by way of example, with reference to the accompanying drawings, in which.

DETAILED DESCRIPTION OF CERTAIN EMBODIMENTS

Embodiments of the present invention provide an offset calibration loop for a low intermediate frequency receiver which compensates for a DC offset arising in components such as an anti-aliasing filter, programmable gain amplifier and/or analog-to-digital converter in the receiver path.

Figure 1:
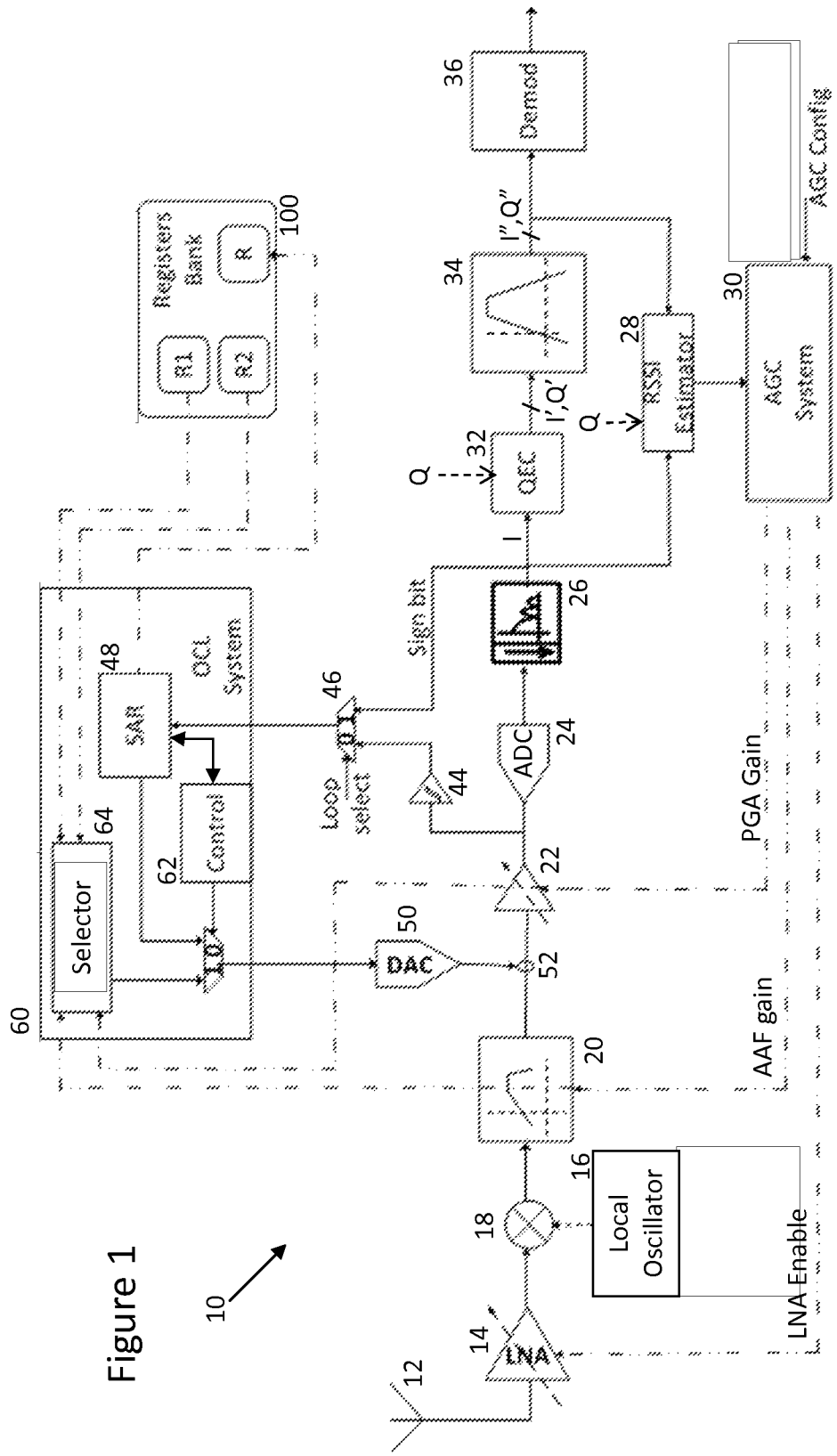
FIG. 1 is a schematic diagram of a low intermediate frequency (IF) receiver with direct current (DC) offset correction according to an embodiment of the present invention.

Referring now to FIG. 1, there is shown an LIF receiver 10 incorporating DC offset correction according to an embodiment of the invention. The receiver 10 comprises an antenna 12 for receiving an RF signal connected to a low noise amplifier (LNA) 14. The amplified signal is combined with a local oscillator (LO) signal 16 by a mixer 18 to provide an intermediate frequency (IF) signal. A typical IF signal would have a center frequency of the order of 100 Khz with a typical channel width of approximately 12.5 KHz.

The receiver 10 may be incorporated in a transceiver also including a transmitter section connected to the antenna 12, but for ease of understanding, a transmitter section is not shown in FIG. 1.

In the embodiment illustrated in FIG. 1, the IF signal is passed through a bandpass anti-aliasing filter (AAF) stage 20. In an LIF receiver where the AAF stage is a low pass filter, the filter typically passes any time-varying (near) DC offset or static DC offset in the signal due to LO leakage and self-mixing in the preceding RF stage. Instead, the illustrated AAF stage 20 having a bandpass response, rejects both static DC offset due to self-mixing of the LO, as well as dynamic offset which arises as a result of time varying antenna load conditions.

It is appreciated that for a bandpass AAF stage to have approximately the same roll-off quality as a low pass filter of the same order, additional filter stages are typically implemented. In the example shown in FIG. 2, the AAF stage 20 comprises a $1^{st}$ order band pass filter 20-1 followed by a $3^{rd}$ order low pass filter 20-2. In other embodiments, the AAF stage 20 could comprise two $2^{nd}$ order low pass filter stages followed by a first order high pass filter stage. In still other embodiments, the AAF stage 20 could comprise a $2^{nd}$ order low pass filter followed by a $2^{nd}$ order bandpass stage and followed by a first order low pass filter stage, and it will be appreciated that still further permutations are also possible.

Referring back to FIG. 1, in the illustrated embodiment, the AAF stage 20 has two programmable gain levels and these are controlled by an Automatic Gain Control (AGC) system 30 as will be explained later.

The filtered intermediate frequency signal passes to a programmable gain amplifier (PGA) 22. The PGA 22 in this example has maximum gain of 31 with 11 programmable gain settings. Other gains and gain settings can alternatively be implemented. In the illustrated embodiment, the gain settings for the PGA 22 divide into two groups, with each group related to an input resistor setting of the PGA. The PGA output is in turn fed to an analog-to-digital converter (ADC) 24, which can be a continuous-time sigma-delta (CT-ΣΔ) ADC.

The digitized signal is then fed to a low-pass cascaded integrator-comb (CIC) filter stage 26 where the signal is filtered, downsampled (decimated) and demodulated.

In FIG. 1, only a receiver path for a single (real) channel is shown, but as will be appreciated from the description below, the invention is equally applicable to each of the I and Q channels of an IQ receiver. In this case, as well as providing an out of phase, specifically a quadrature phase, version of the LO signal, each of the mixer 18, the AAF stage 20, the PGA 22, the ADC 24 and the filter stage 26 would be implemented for each of the I and Q channels. For clarity, only the final baseband Q signal for an IQ receiver path is shown in FIG. 1, with the I signal being provided through the receiver path 14-26 shown.

In an IQ receiver implementation, the baseband signal for each of the I and Q channels is fed to a quadrature error correction (QEC) module 32 which corrects for mismatches between I and Q channels to produce error corrected signals I' and Q'. The complex QEC module output I' and Q' is fed to a complex digital channel filter 34 whose output signals I", Q" are then provided to a demodulator 36 for output as a digital data signal and subsequent data processing. Suitable demodulation schemes include quadrature amplitude modulation (QAM) and frequency shift key (FSK) modulation. Together, the filter stage 26, the QEC module 32, the complex digital channel filter 34 and the demodulator 36 can function as a converter to convert a digital signal to a baseband digital signal. In some other implementations, the output of the ADC 24 can be converted by any other suitable converter configured to convert a digital signal to a baseband digital signal.

A received signal strength indicator (RSSI) module 28 detects the magnitude of the baseband signal either a real signal or the I and Q channel signals—and the digital filtered signals in this case I",Q"- and passes a control signal(s) to the AGC system 30. In an IQ receiver, for example, the RSSI can comprise two estimators—one looking at filtered ADC output from each of the I and Q stages 26 and other looking at the channel filter outputs I", Q". Both estimators are therefore I/Q path—one estimates the wanted signal, i.e., the channel filter outputs I", Q", and other estimates both the wanted and out-of-band blockers, i.e., the ADC filtered I/Q output estimator. These two RSSI values are used by the AGC system 30 to make appropriate decisions.

For a single real channel receiver, the QEC module 32 and filter 34 would typically be omitted and the RSSI estimator 28 could simply connect to the output of the filter stage 26.

When configured to run freely, the AGC system 30 programs the gain for the AAF 20 and the PGA 22 responsive to the control signal received from the RSSI 28. In the present embodiment, the AGC can also be set to a manual mode to allow the gain for the PGA 22 and/or the AAF 20 to be set to a fixed level. Also in the illustrated embodiment, the AGC system 30 is arranged to enable or disable the LNA 14.

Figure 2:
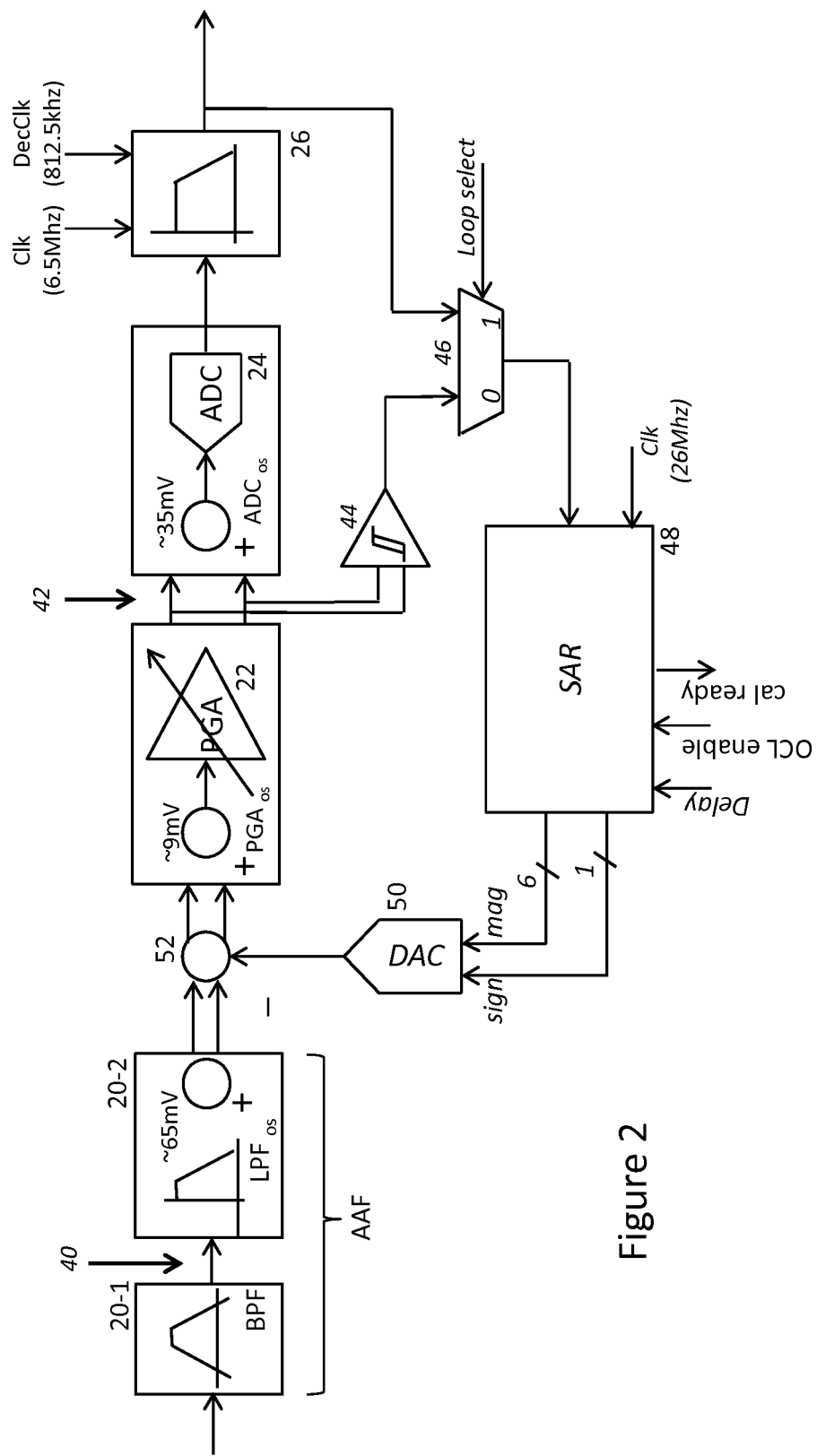
FIG. 2 illustrates in detail the sources of offset within the components of FIG. 1 as well as the components involved in offset estimation.

Referring now to FIG. 2, it will be seen that the various components in the receiver path 14-24 or, if duplicated, paths generate a range of static DC offset.

At the output 40 of the bandpass filter stage 20-1, there is substantially no DC offset. However, in this example, the low pass filter stage 20-2 can produce as much as 65 mV-80 mV static offset. In this example, the PGA 22 contributes a baseline DC static offset on the order of 9 mV. However, when this and the filter stage offset are multiplied by the PGA maximum gain of 31, DC offset at the PGA output 42 in this example, could range from ~2.3-2.8V in the illustrated embodiment. The ADC 24 in turn contributes up to about 25 mV in DC offset in this example.

It will be appreciated that a PGA 22 such as that shown in FIGS. 1 and 2 has a relatively quick settling time, whereas the filter stage 26 has a longer settling time.

In the illustrated embodiment, two static DC offset calibration loops are provided: a first inner loop for performing a relatively fast and rough calibration in response to the DC offset generated within the AAF 20 and PGA 22; and a second outer loop for performing a slower, finer calibration taking into account the DC offset generated within the AAF 20, PGA 22 and ADC 24.

The inner loop comprises a signal sensor, such as a comparator 44, with differential inputs connected to the differential output of the PGA 22. The comparator output is connected to one input of a switch 46 which is controlled by firmware to determine whether the inner or outer loop is calibrated. While the switch 46 is illustrated as a multiplexer, any equivalent circuit can implement the switch 46. The outer loop comprises a direct connection from the polarity output of the filter stage 26 to the other input of the switch 46. Thus each of the inner and outer loops provide a polarity signal indicative of whether the DAC setting is too large or too small to compensate for DC offset. The remainder of each loop can thus be common with the output of the switch 46 being connected to a successive approximation register (SAR) module 48. The SAR module 48 controls a programmable DC signal source, such as a digital-to-analog converter (DAC) 50 in FIG. 1, which in turn injects a DC signal into a subtractor 52 (or alternatively an adder) interposed between the AAF 20 and the PGA 22. In the illustrated embodiment, the DAC 50 is a 6-bit device with a least significant bit (LSB) corresponding to an output signal of approximately 38-40 mV, so providing a maximum offset correction of approximately 2.4V. The SAR module 48 can include a second signal sensor that serves to determine a polarity of a baseband signal that is selected. The SAR module 48 can provide a sign signal that is indicative of the polarity of the baseband signal to the DAC 50.

When the inner loop is selected, the SAR module 48 is configured with an input indicating a short delay between steps; whereas when the outer loop is selected, the SAR module 48 is configured through the same input indicating a longer delay between steps. For example, the longer delay can cause the outer loop to take approximately 5 times longer to calibrate than the inner loop with outer loop calibration typically taking approximately 20 μs for each AAF/PGA gain setting for which calibration is performed.

The SAR module 48 uses the flipping of the polarity output from the comparator 44 or the filter stage 26 depending on the setting of the DAC 50 to determine the DAC setting which balances the DC offset in whichever of the inner or the outer loop is being calibrated. It will be appreciated that SAR is just one technique for determining the DAC setting which compensates for static DC offset within the loops and many such techniques including an exhaustive search could be employed. Nonetheless, it will be appreciated that employing a SAR module provides for a fast and so time and energy efficient search.

Figure 3:
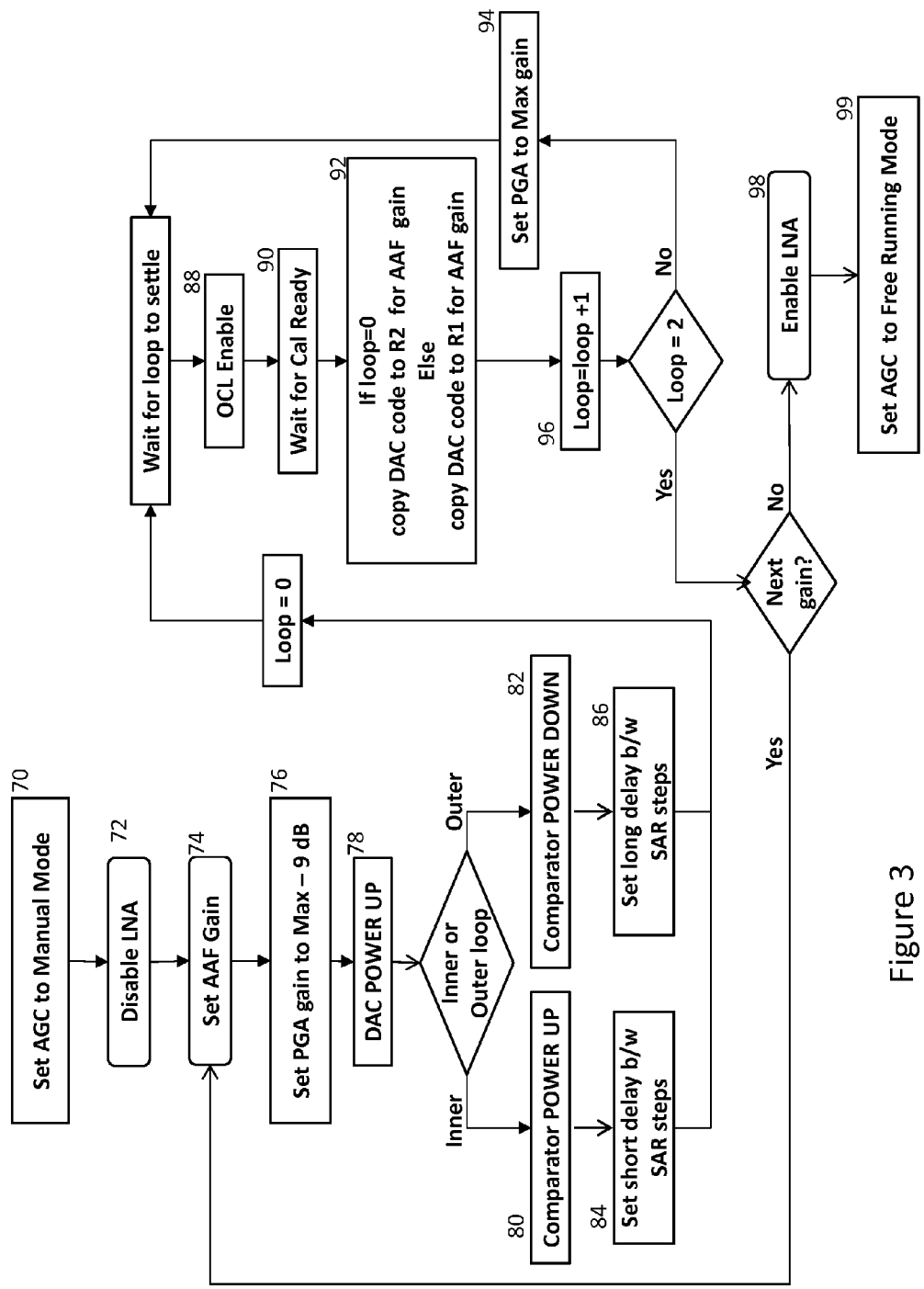
FIG. 3 shows a firmware flow chart for calibrating the LIF receiver of FIG. 1.

Referring back to FIG. 1, the inner and outer calibration loops of FIG. 2 comprise components for a firmware controlled controller, such as an offset correction loop (OCL) system 60. FIG. 3 comprises a flow diagram illustrating generally the operation of the calibration control firmware running in the OCL system 60.

When calibration for static DC offset is desired, the OCL system controller 62 first begins by setting the AGC system 30 to manual mode, operation 70. Control commands between the controller 62 and AGC system 30 can be performed by sending a SPI-write (a bus control command) to the AGC system 30 across a system bus (not shown). The controller 62 then commands the AGC to disable or switch off the LNA 14, operation 72, to avoid any external signals affecting the calibration. The AAF filter gain is then set to a first gain level, operation 74. The controller 62 then has the AGC system 30 set the PGA gain to its maximum minus 9 dB, operation 76. (In alternative implementations, PGA Max-6 dB could be used or indeed any number within the range of the PGA gain could be used.)

It will be appreciated that the arrangement of functional blocks of the OCL system 60 and its interaction with the remainder of the receiver 10 is for illustrative purposes only and that, for example, functionality described as being performed by the controller 62 can be performed in any number of ways including in dedicated hardware, software or firmware or any combination therefore. Equally this functionality can be implemented within the OCL system 60 or off-board.

9 dB is chosen as this level is not ratiometrically related to the PGA maximum gain. It will be appreciated that the invention is not limited to this particular gain level and any such level could be employed. Nonetheless, as indicated earlier, in the embodiment, all other PGA gain levels are ratiometrically related either to the PGA maximum gain or to the PGA Max-9 dB level and the utility of this approach will be explained in more detail below.

The controller 62 then powers up the DAC 50, operation 78 and then depending on whether the inner or outer loop is being calibrated, the comparator 44 is either switched on or off, operations 80 and 82, respectively. For the inner loop, short SAR steps are chosen whereas for the outer loop longer SAR steps are used, operations 84 and 86, respectively. Once the loop has settled, the controller signals to the SAR module 48 with an OCL enable signal that it may proceed, operation 88. When the SAR module is complete, it replies by asserting a cal ready signal which is detected by the controller 62, operation 90.

As will be seen in FIG. 1, a bank of registers R, R1 and R2 are maintained in memory 100. Once the SAR module 48 has determined the DAC setting for a given AAF and PGA gain setting, the result is written to a temporary register R. In the first iteration through the loop 88-96, with the first AAF filter gain and PGA Max-9 dB level, the content of temporary register R is written to register R2.

Figure 4:
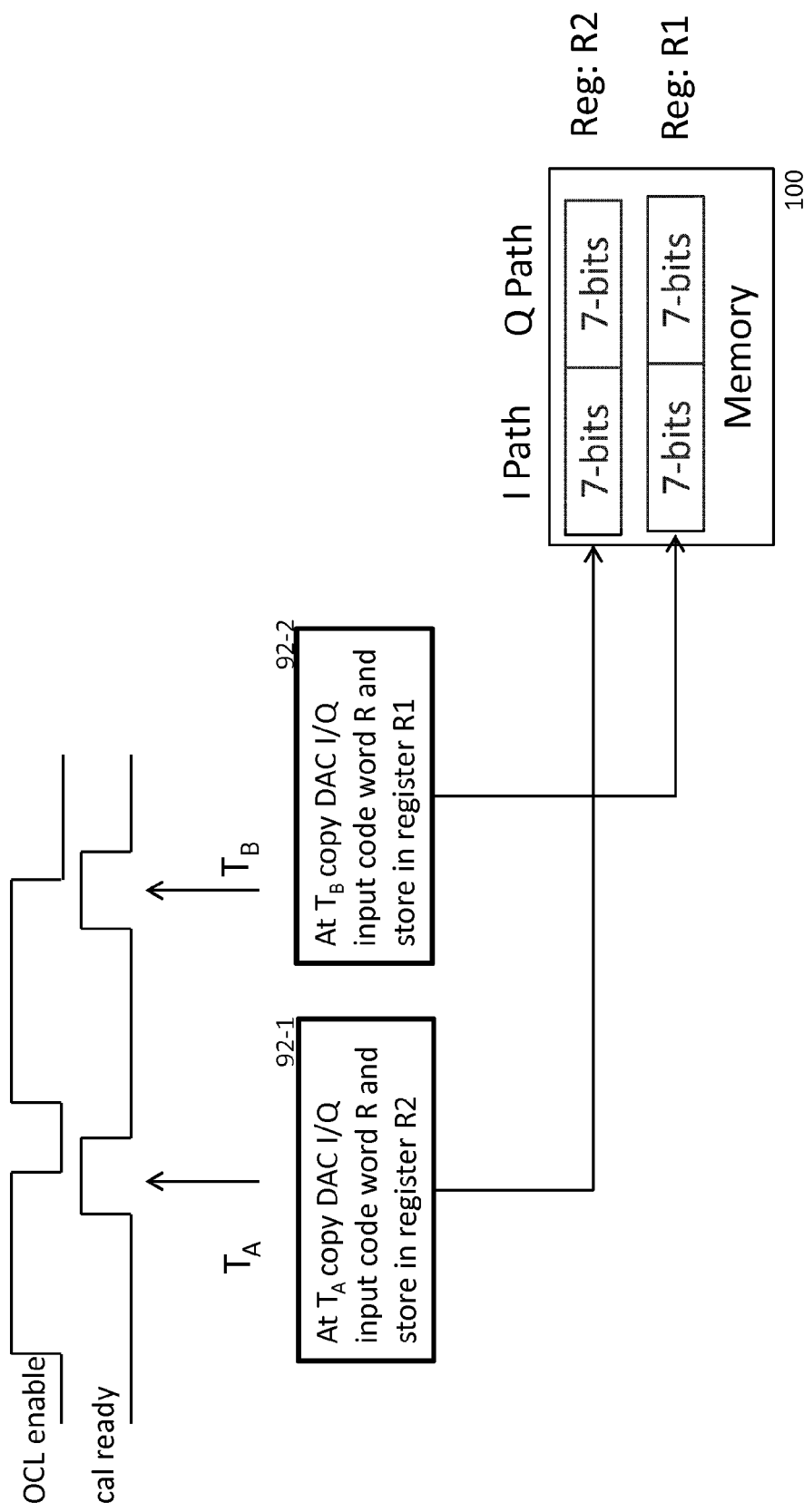
FIG. 4 shows calibration timing and DAC setting registers for the LIF receiver of FIG. 1.

For an IQ receiver, the comparator 44, switch 46 and DAC 50 are also duplicated and if speed of calibration is of particular concern, the SAR module 48 functionality could also be duplicated. In any case, the I and Q paths for a given pair of AAF and PGA gains can be determined either in parallel or successively within a single loop 88-96 shown in FIG. 3 and the DAC settings for each of the I and Q channels written to a pair of registers R2 or an extended (concatenated) register R2 holding both values as shown in FIG. 4. Note that each register R1 and R2 comprises 7 bits, six determining DAC output signal magnitude and one for DAC output signal polarity.

The process continues by setting the PGA 22 to its maximum gain, operation 94, and repeating operations 88-92. In this case, the DAC setting for each channel is written from register R to register R1.

Operations 74 to 96 are then repeated for a second AAF gain value and again DAC settings for each of the I and Q channels for PGA Max and PGA Max-9 dB are stored in a second set of R1 and R2 registers for the second AAF gain level. If further AAF gain values were available, then operations 74 to 96 could be repeated again.

Calibration is now complete and the LNA 14 can be enabled, operation 98, before setting the AGC system 30 to free running mode, operation 99.

It should be appreciated that in different receiver configurations, various of the above operations could be re-ordered and additional operations that take into account receiver operation and as such FIG. 3 should be interpreted as illustrative only. Any combination of the features of the discussed with reference to FIG. 3 or any of the other methods discussed herein may be embodied in non-transitory computer storage. When instructions stored in the non-transitory computer storage are executed by, for example, a processor, the instructions may cause some or all of the method of FIG. 3 to be performed.

Figure 5:
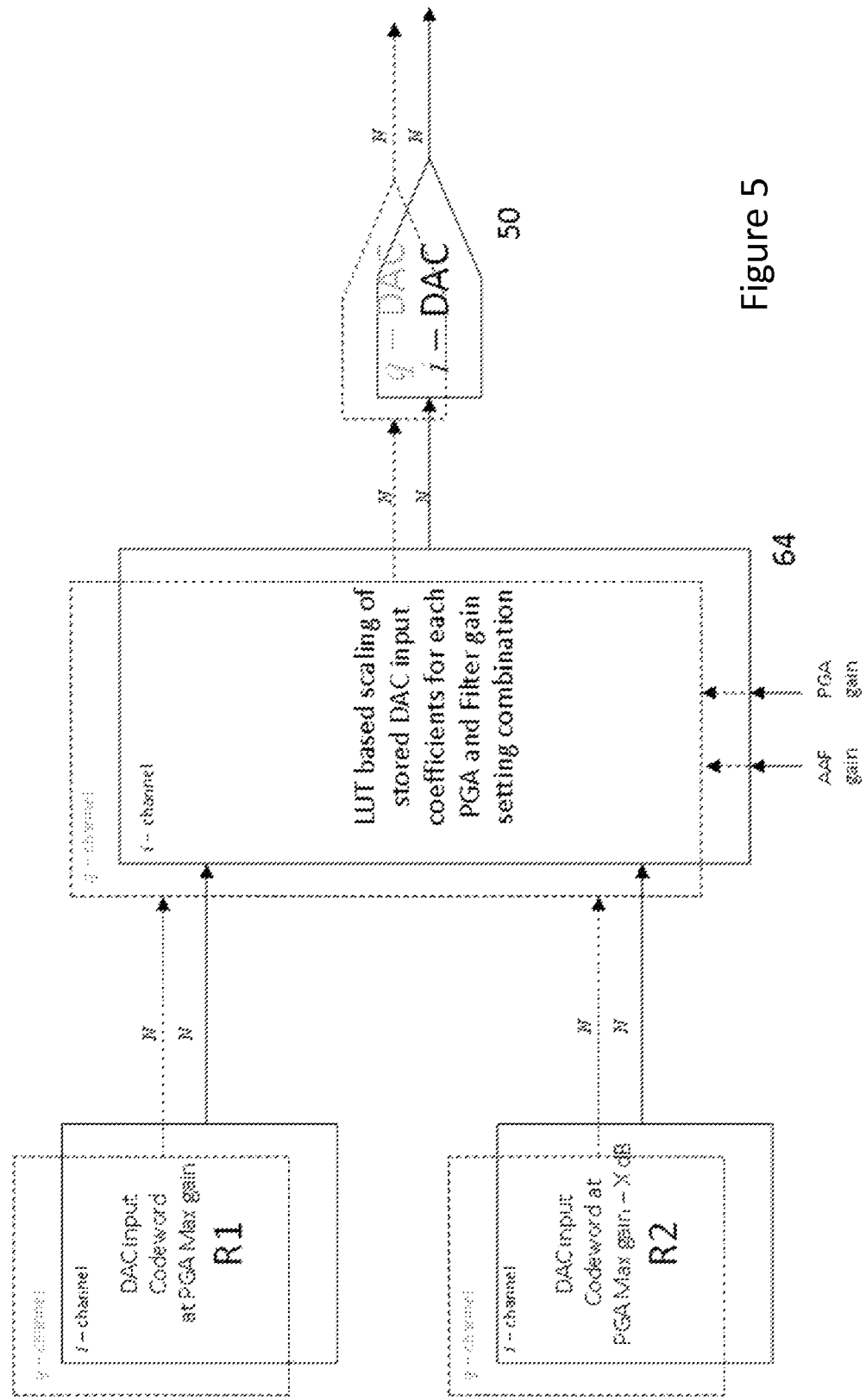
FIG. 5 shows in more detail a selector employed within the LIF receiver of FIG. 1.

Referring now to FIGS. 1 and 5, the OCL system 60 includes a selector 64 which is operatively connected to the registers R1, R2 and to the AAF and PGA gain settings. Again, as shown in FIG. 5, the selector 64 is duplicated for each of the I and Q channels. When each AGC system 30 for the I and Q channels are running freely, they alter the gain levels for the AAF 20 and PGA 22 according to the received signal strength. Depending on whether the current PGA gain is ratiometrically related to the PGA Max or PGA Max-9 dB level, the stored value in register R1 or R2 for the current AAF filter gain is read and then divided as necessary according to the current PGA gain level to determine the desired setting for each of the I and Q channel DACs 50. This division can be performed for example by shifting the contents of a look-up table (LUT) according to the PGA gain level.

These DACs then inject the desired amount of current into the receiver path(s) at their respective subtractor(s) 52 to compensate for static DC offset.

Thus, during dynamic packet reception, the AGC system 30 commands the PGA and AAF gain changes in response to the receive signal strength indicator (RSSI) 28. This maintains gain through the receiver at its optimum level for maximum sensitivity while preventing overloading of the signal chain by strong signals. In order to minimize the impact on bit-error rate (BER) of changes in DC offset due to the gain changes, the OCL system 60 adjusts the offset correction DAC input code word according to the stored correction coefficients R1, R2. In this way the offset change due to a gain change is quickly removed, allowing the common mode of the analog components to settle out to steady state values in order not to impact packet reception.

It will be appreciated that calibration is carried out offline and may only be performed once in the lifetime of a receiver or at reboot or power up or system restart. However, if for example a receiver were to operate across a large temperature range, then recalibration could be triggered if an operating temperature were detected to have deviated by more than a threshold amount from an operating temperature for a previous calibration. Equally calibration might be periodically triggered after long periods of device operation to take into account any deviations caused by device aging.

It will be appreciated that many further variants of the above described embodiments are possible. So for example, rather than only being able to select either inner or outer loop calibration, the receiver 10 could be arranged to allow for inner loop calibration to be followed by outer loop calibration the latter refining the DAC settings R1, R2 determined for the former.

By calibrating and storing correction coefficients R1,R2 at two gain settings of the PGA off-line as in the illustrated embodiment, static offset can be quickly reduced to within 1-LSB of the DAC 50 in response to AGC control during normal receiver operation by subtracting (or adding) current related to the correction coefficients.

Nonetheless, it will be seen that the invention is not limited to receivers having an AAF gain stage with programmable gain or with two gain settings and the invention can equally be extended to operate with more than two AAF stage gain settings. Similarly, the invention is not limited to the particular form of selector illustrated in FIG. 5 so that although calibration time might be increased somewhat, DAC settings $R_1 \ldots R_n$ could be acquired and stored for each AAF and PGA gain setting and read directly from memory as required. Nonetheless, one benefit of the selector of FIG. 5 is storage in that instead of requiring n×14 bits, in the illustrated embodiment, only 2×14 bits of memory are required i.e. in this particular implementation only R1 & R2 which are 14-bits wide are required and they are good enough for the gain settings of the PGA 22.

In still further variants of the illustrated embodiment, instead of being interposed between the AAF 20 and PGA 22 stages, the subtractor 52 (or adder) could be interposed between the PGA 22 and ADC 24 stages; or before the AAF 20; or it can also be between inner stages of the AAF 20.

The systems, apparatus, and methods for offset calibration described above with reference to certain embodiments. A skilled artisan will, however, appreciate that the principles and advantages of the embodiments can be used for any other systems, apparatus, or methods with a need for offset calibration.

Such systems, apparatus, and/or methods can be implemented in various electronic devices. Examples of the electronic devices can include, but are not limited to, consumer electronic products, parts of the consumer electronic products, electronic test equipment, wireless communications infrastructure, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Description of Preferred Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A low intermediate frequency (LIF) receiver comprising a receiver path, the receiver path comprising:
   a programmable gain amplifier (PGA) configured to amplify a filtered intermediate frequency (IF) signal derived from a received radio frequency (RF) signal,
   an analog-to-digital converter (ADC) configured to convert said amplified filtered IF signal to a digital signal, and
   a converter configured to convert said digital signal to a baseband digital signal,
said LIF receiver further comprising:
   a programmable direct-current (DC) signal source configured to inject a programmed DC offset signal into said receiver path so as to adjust a DC offset in said amplified filtered IF signal,
   a signal sensor operatively connected to said receiver path between said PGA and an output of said receiver path, the signal sensor configured to provide a polarity signal associated with said amplified filtered IF signal, and
   a controller electrically coupled to the signal sensor, the controller configured to determine a value of the programmed DC offset signal causing a magnitude of said baseband digital signal in the absence of said received RF signal for at least one gain setting of said PGA to be reduced relative to a magnitude of said baseband digital signal corresponding to another value of the programmed DC offset signal in the absence of said received RF signal for the at least one gain setting of said PGA.

2. The LIF receiver according to claim 1 wherein said PGA is configured to provide a differential signal output and wherein said signal sensor comprises a comparator connected to said differential signal output to indicate a polarity of said PGA output.

3. The LIF receiver according to claim 2 further comprising a second signal sensor operatively connected to said converter output and configured to determine a polarity of said baseband digital signal for said programmed DC offset signal, said controller being operable to selectively switch between said signal sensors.

4. The LIF receiver according to claim 3 wherein said controller is arranged to allow a longer delay between changing said programmed DC offset signal when said second signal sensor is selected than when an output of said comparator is selected.

5. The LIF receiver according to claim 1 wherein said controller further comprises a successive approximation register (SAR) configured to determine said programmed DC offset signal minimizing a magnitude of said baseband digital signal in the absence of a received RF signal for at least one gain setting of said PGA.

6. The LIF receiver according to claim 1 wherein said receiver path further comprises an automatic gain controller (AGC) configured to set a gain of said PGA in response to a magnitude of said received RF signal, wherein said controller is operatively connected to said AGC to determine a gain setting of said PGA in the presence of said received RF signal and wherein said controller is arranged to adjust said programmed DC offset signal in accordance with said gain setting.

7. The LIF receiver according to claim 6 wherein said receiver path further comprises a bandpass filter configured to filter an IF signal and to provide said filtered IF signal, wherein said bandpass filter comprises a programmable gain filter operatively controlled by said AGC and wherein said controller is arranged to determine a programmed DC offset signal minimizing a magnitude of said baseband digital signal in the absence of a received RF signal for at least one gain setting of said PGA for each gain setting of said bandpass filter and said controller is operatively connected to said AGC to determine a gain setting of said bandpass filter in the presence of a received RF signal and wherein said controller is arranged to adjust said programmed DC offset signal in accordance with said PGA and said bandpass filter gain setting.

8. The LIF receiver according to claim 6 wherein said PGA comprises at least two groups of gain settings, each group of gain settings comprising settings which are ratiometrically related to one another wherein said controller is arranged to determine a programmed DC offset signal minimizing a magnitude of said baseband digital signal in the absence of a received RF signal for at least one gain setting of each group.

9. The LIF receiver according to claim 8 in which each programmed DC offset signal is stored in a memory and wherein said controller is arranged to retrieve a programmed DC offset signal from said memory in accordance with said gain setting of said PGA in the presence of a received RF signal and wherein said controller is arranged to adjust said programmed DC offset signal in accordance with said gain setting and said retrieved programmed DC offset signal.

10. The LIF receiver according to claim 9 in which one group of PGA gain settings are ratiometrically related to PGA maximum gain and wherein one group of PGA gain settings are ratiometrically related to PGA maximum gain minus a selected offset.

11. The LIF receiver according to claim 10 wherein the selected offset within the range of the PGA gain.

12. An IQ receiver comprising the LIF receiver according to claim 1 and further comprising a second receiver path including:
a second programmable gain amplifier (PGA) configured to amplify a second filtered IF signal derived from said received RF signal,
a second analog-to-digital converter (ADC) configured to convert said second amplified filtered IF signal to a second digital signal, and
a second converter configured to convert said second digital signal to a second baseband digital signal; and
said IQ receiver further comprising:
a second programmable direct-current (DC) signal source configured to inject a second programmed DC offset signal into said second receiver path so as to adjust a DC offset in said second amplified filtered IF signal, and
a second signal sensor operatively connected to said second receiver path between said second PGA and an output of said second receiver path, said second signal sensor configured to determine a polarity associated with said second amplified filtered IF signal, and
wherein said controller is further arranged to determine a value of the second programmed DC offset causing a magnitude of said second baseband digital signal in the absence of said received RF signal for at least one gain setting of said second PGA to be reduced relative to a magnitude of said second baseband digital signal corresponding to another value of the second programmed DC offset signal in the absence of said received RF signal for the at least one gain setting of said second PGA.

13. The LIF receiver according to claim 1 further comprising a received signal strength indicator (RSSI) module configured to determine a magnitude of said received RF signal.

14. The LIF receiver according to claim 1, the receiver further including an antenna configured to provide said received radio frequency (RF) signal and a first amplifier stage operatively connected to said antenna configured to amplify said received RF signal, wherein said receiver path comprises a mixer operatively connected to said first amplifier stage.

15. The LIF receiver according to claim 14 wherein said receiver path further comprises an automatic gain controller (AGC) configured to set a gain of said PGA in response to a magnitude of said received RF signal, wherein said AGC is operatively connected to said first amplifier stage to selectively disable said first amplifier stage so that said controller can determine said programmed DC offset signal minimizing a magnitude of said baseband digital signal in the absence of a received RF signal.

16. The LIF receiver according to claim 14 further comprising a demodulator configured to convert said baseband digital signal into a digital data signal.

17. The LIF receiver according to claim 1 wherein said programmable direct-current (DC) signal source comprises a digital-to-analog converter (DAC).

18. The LIF receiver according to claim 1 wherein said LIF receiver is configured to inject said programmed DC offset signal into said filtered IF signal.

19. The LIF receiver according to claim 18 wherein one of an adder or a subtractor is configured to inject said programmed DC offset signal into said filtered IF signal.

20. A low intermediate frequency (LIF) receiver comprising:

a programmable gain amplifier (PGA) configured to amplify an IF signal derived from a received radio frequency (RF) signal, said PGA providing a differential signal output, an analog-to-digital convertor (ADC) configured to convert said amplified filtered IF signal to a digital signal, a converter configured to convert said digital signal to a baseband digital signal, a programmable direct-current (DC) signal source configured to inject a programmed DC offset signal into a signal path of the receiver so as to adjust a DC offset in said amplified filtered IF signal, a signal sensor comprising a comparator configured to receive said PGA differential signal output and to indicate a polarity associated with said PGA differential output signal, a second signal sensor operatively connected to an output of said converter, said second signal sensor configured to determine a polarity associated with said baseband digital signal, and a controller operable to selectively switch between said first and second signal sensors to determine a value of the programmed DC offset signal causing a magnitude of said baseband digital signal in the absence of a received RF signal for at least one gain setting of said PGA to be reduced relative to a magnitude of said baseband digital signal corresponding to another value of the programmed DC offset signal in the absence of said received RF signal for the at least one gain setting of said PGA.

21. A transceiver comprising the LIF receiver according to claim 1 and a transmitter path operatively connected to an antenna.

22. A low intermediate frequency (LIF) receiver comprising:

a receiver path configured to receive a radio frequency (RF) signal and to provide an output signal at an output, said receiver path comprising a programmable gain amplifier (PGA) configured to provide an amplified intermediate frequency (IF) signal, a programmable direct-current (DC) signal source configured to inject a programmed DC offset signal into said receiver path so as to adjust a DC offset in said amplified IF signal, a signal sensor operatively connected between said PGA and said output of said receiver path, and a controller configured to receive an output of said signal sensor and to determine a value of said programmed DC offset signal associated with a transition in polarity of the output of said signal sensor.

* * * * *